United States Patent [19]

Chenevas-Paule et al.

[11] Patent Number: 4,604,527
[45] Date of Patent: Aug. 5, 1986

[54] APPARATUS FOR POINT-BY-POINT READING OF DOCUMENTS USING PHOTODETECTOR MATRIX

[75] Inventors: André Chenevas-Paule, Grenoble; Robert Cuchet, Clelles, both of France

[73] Assignee: Commissariat a l'Energie Atomique, Paris, France

[21] Appl. No.: 550,769

[22] Filed: Nov. 10, 1983

[30] Foreign Application Priority Data

Nov. 17, 1982 [FR] France ............................. 82 19229

[51] Int. Cl.⁴ .......................................... H01J 40/14
[52] U.S. Cl. .................................... 250/578; 358/213
[58] Field of Search ............. 250/578, 211 S; 357/30, 357/19; 358/213, 212

[56] References Cited

U.S. PATENT DOCUMENTS 4,064,521 12/1977 Carlson ................................. 357/30
4,233,506 11/1980 Yamamoto et al. ................ 250/227
4,407,010 9/1983 Baji et al. ............................. 357/30
4,499,384 2/1985 Segawa et al. .................... 250/211 J

FOREIGN PATENT DOCUMENTS 0075858 6/1983 European Pat. Off. .

Primary Examiner—David C. Nelms
Assistant Examiner—Lark W. Madoo
Attorney, Agent, or Firm—Michael N. Meller

[57] ABSTRACT

The invention relates to a point-by-point reading apparatus using a matrix of photodetector elements. The reading apparatus comprises a system of p groups of q basic elements, which are aligned, each of these basic elements being constituted by a photodiode and a diode insensitive to the light radiation and connected in opposition. These basic elements are addressed by an input circuit of the shift register type with p connections, each connected to all the diodes of the same group. The state of the photodiodes is collected in an output circuit with q connections, each connected to all the photodiodes occupying a particular rank in a group.

5 Claims, 6 Drawing Figures

APPARATUS FOR POINT-BY-POINT READING OF DOCUMENTS USING PHOTODETECTOR MATRIX

BACKGROUND OF THE INVENTION

The present invention relates to an apparatus for the point-by-point reading of a document using a matrix of photodetector elements. It is used more particularly in analysis of documents for telescoping.

According to the prior art, represented in particular by ACTA ELECTRONICA, vol. 21, no. 1, 1978, pp. 55–79, the analysis means of telecopiers comprise a reading head constituted by a strip of photodetector elements. In general terms, for reading a standard A4 document, the strip has 1728 aligned photodetector elements making it possible to analyze one line of the document. In order to reduce the number of connections between the photodetector element and the electronic processing circuits, there is a multiplexed addressing of these photodetector elements. These addressing circuits are produced on the actual strip. FIG. 1 gives an example of such a known strip. In the special case of FIG. 1, the photodetector elements constituting the reading head 4 of the strip are photodiodes 2 aligned along axis XX, but could equally well be photoresistors, phototransistors and in general terms any element supplying a current proportional to the light radiation received. These photodetector elements are arranged in p groups of q elements. Two circuits $E_x$ and $E_y$ control switches making it possible to separately address each photodetector element. These switches are generally realized by means of MOS transistors, whose grid is connected to circuits $E_x$ and $E_y$. Circuit $E_x$ has p connections, each making it possible to select all the photodetector elements of a particular group. Circuit $E_y$ has q connections, each making it possible to select all the photodetector elements occupying a particular rank in a group. When a photodetector element is simultaneously selected by circuit $E_x$ and by circuit $E_y$, it is activated, i.e. it can supply a signal which is a function of the illumination received on connections $S_1, \ldots S_q$ of output circuit S.

The analysis of the state of each of the photodetector elements of the strip takes place in the following way. In the initial state, the p connections $X_1, X_2, \ldots X_p$ of $E_x$ and the q connections $Y_1, Y_2 \ldots Y_q$ of $E_y$ are in an electrical state such that all the switches are open. The first group of q photodetector elements is then selected by bringing about the appearance on connection $X_1$ of circuit $E_x$ of an electrical state controlling the closing of switch $I_1$. The first photodetector element of the group is then made active by bringing about the appearance on connection $Y_1$ of circuit $E_y$ of an electrical state controlling the closing of switch $I_{11}$. An electrical state then appears on connection $S_1$ of output circuit S, which is a function of the activated photodetector element. This signal is collected and then switch $I_{11}$ is opened. The same performed for each of the photodetector elements of the group. Switch $I_1$ is then opened and then the same sequence of operations as for the first group is carried out for each of the other groups.

The main disadvantage of this MOS switch - photodiode system is the extraction of a low level signal on connections $S_1, S_2 \ldots S_q$ of output circuit S. Thus, the closing of switches $I_{11}, I_{21} \ldots I_{p1}$ controlled by connection $Y_1$ of circuit $E_y$ induces on connection $S_1$ of output circuit S a by no means negligible switching noise, which is prejudicial to the operation of said low level signal. In the same way, the closing of the switches respectively controlled by connections $Y_2, Y_3, \ldots Y_q$ of circuit $E_y$ induces a switching noise on the corresponding connections $S_2, S_3 \ldots S_q$ of output circuit S.

SUMMARY OF THE INVENTION

The present invention mainly constitutes an original matrixing solution for the multiplexed photodetectors.

The object of the invention is to attenuate the switching noise, by substituting for the basic MOS switch - photodiode element, a basic element constituted by two diodes connected in opposite positions, one of these diodes being photosensitive.

More specifically, the present invention relates to an apparatus for the point-by-point reading of a document using a matrix of photodetector elements, comprising p groups of q basic elements aligned along an axis XX, each provided with an input terminal and an output terminal, a circuit having p connections, each being connected to the input terminal of each of the basic elements of a given group, an output circuit having q connections, each being connected to the output terminal of each of the basic elements occupying a particular rank in the different groups, wherein each basic element is constituted by a photodiode and a diode which is insensitive to light radiation, one of the electrodes of the photodiode being connected to the electrode of the diode of the same polarity, the other electrode of the photodiode being the output terminal of the basic element, the electrode of the diode not connected to the photodiode being the input terminal of the basic element and the addressing circuit with p connections is of the shift register type.

In a preferred manner, the diode of each basic element is a photodiode identical to the photodiode of the same basic element made insensitive to any light radiation. This preferred construction simplifies the realization of each strip.

The term identical photodiodes is understood to mean photodiodes constituted by the same semiconductor layers. The electrodes of these photodiodes can however, differ either by their nature, or by their thickness. The photodiodes can be of any random type, e.g. of the Schottky, PN, PIN (P intrinsic N), MIS (metal—insulant—semiconductor) or similar photodiodes. The photodiodes are produced by means of a semiconductor chosen from among hydrogenated amorphous silicon, polycrystalline silicon, gallium arsenide (GaAs) and cadmium selenide (CdSe).

According to a secondary feature, each basic element of axis YY perpendicular to axis XX is constituted by:
an insulating substrate,
two electrodes along axis YY, arranged symmetrically on either side of axis XX, a negatively doped semiconductor layer partly covering each electrode,
an intrinsic semiconductor layer covering the preceding layer and the interelectrode space,
a light radiation-transparent, Schottky electrode covering the preceding layer and constituting the input face of the photodetector,
a light radiation-opaque resin covering that part of the preceding electrode contained in a single halfplane defined by axis XX.

The photodiode is illuminated by the upper common electrode. It is also possible to illuminate the photodiode by the transparent substrate. The two embodiments can be envisaged with all diode and semiconductor types.

According to another secondary feature, each photodetector element of axis YY is constituted by:
 a light radiation-transparent insulating substrate,
 a light radiation-transparent Schottky electrode, positioned in axis YY in a half-plane defined by axis XX and constituting the input face of the photodetector,
 a light radiation-opaque Schottky electrode arranged symmetrically with respect to the light radiation-transparent electrode in the other half-plane defined by axis XX,
 an intrinsic semiconductor layer arranged along axis YY and partly covering each electrode,
 a highly negatively doped semiconductor layer covering the preceding layers,
 a light radiation-opaque electrode covering the preceding layer.

The invention also relates to an apparatus for the point-by-point reading of a colour document having on the same substrate several reading apparatuses according to the invention and which are aligned along a same axis XX and in which the basic elements of each reading apparatus are covered by a filter absorbing part of the optical spectrum.

For examplem it is possible to arrange on the same substrate three parallel reading apparatuses, which are displaced by a few hundred micrometers. In order to obtain a colour reading apparatus, it is possible e.g. to cover each reading apparatus with a coloured filter, whose colours are complementary and can be red, green and blue. Another way of obtaining a colour reading apparatus is, e.g. to choose photodiodes which are sensitive to part of the optical spectrum. The reading time of this colour reading apparatus is substantially identical to the reading time of the apparatus having a single reading head, because the three electrically independent reading heads operate simultaneously.

BRIEF DESCRIPTION OF THE DRAWINGS

The invention is described in greater detail hereinafter relative to non-limitative embodiments and with reference to the attached drawings, wherein:

FIG. 2b shows the current - voltage characteristic of the basic element of FIG. 2a.

DETAILED DESCRIPTION OF THE INVENTION

Figure 1:
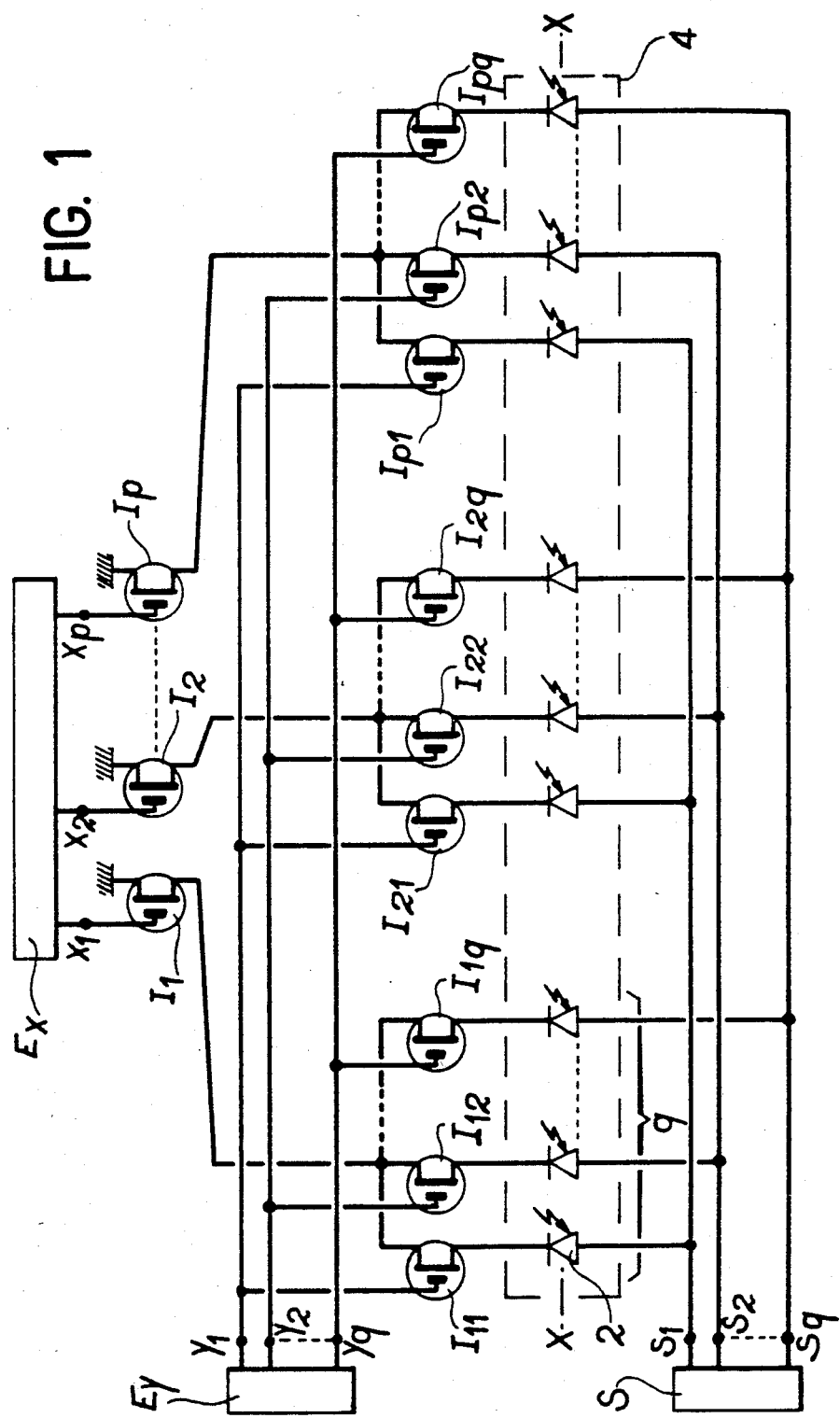
FIG. 1 schematically depicts a prior art strip of photodetector elements.
Figure 2A:
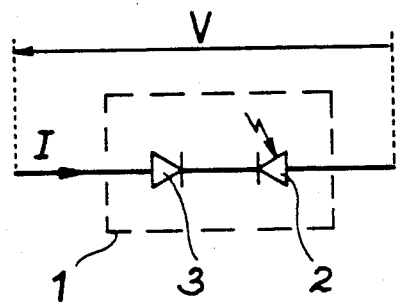
FIG. 2a schematically depicts a basic element of the apparatus.

FIG. 2a shows a basic element 1 according to the invention forming a dipole. A photodiode 2 is connected in opposition with a diode 3. The common electrode can either be the cathode (as in FIG. 2) or the anode. The voltage V represents the potential difference at the terminals of the dipole from the electrode of diode 3 to the electrode of photodiode 2. The current I is counted positively from diode 3 to photodiode 2.

Figure 2B:
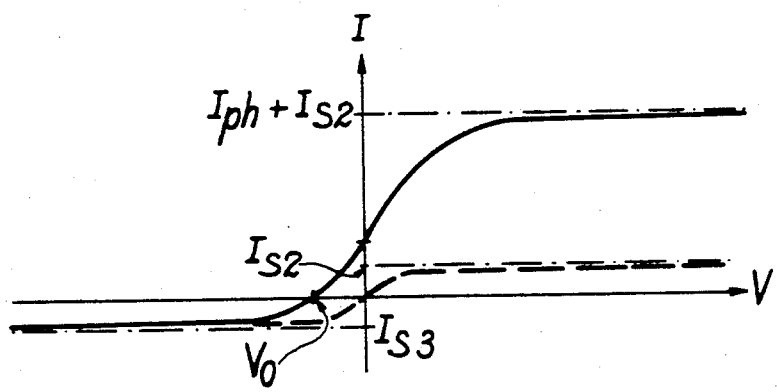

FIG. 2b shows the configuration of the current - voltage characteristic of the dipole. Photodiode 2 and diode 3 each have a saturation current or inverse current. This current is very low and is approximately $10^{-12}$A. It is represented by the quantity $I_{S2}$ for photodiode 2 and $I_{S3}$ for diode 3. The quantity $I_{ph}$ represents the current produced by the photons illuminating photodiode 2.

The slashed curve represents the characteristic of basic element 1 when the photodiode 2 is not illuminated. No matter what the voltage at the terminals of the basic element 1, the current circulating in the system is between $I_{S2}$ and $I_{S3}$. The basic element 1 is non-conductive, and then behaves like an open switch.

The continuous curve represents the characteristic of basic element 1 when the photodiode 2 is illuminated. When the polarization voltage is below $V_o$, the circulating current is between $-I_{S3}$ and 0. The basic element 1 is then non-conductive. When the polarization voltage exceeds $V_0$, it is conductive. The current is then proportional to the polarization voltage up to an asymptotic value equal to $I_{S2}+I_{ph}$.

Figure 3:
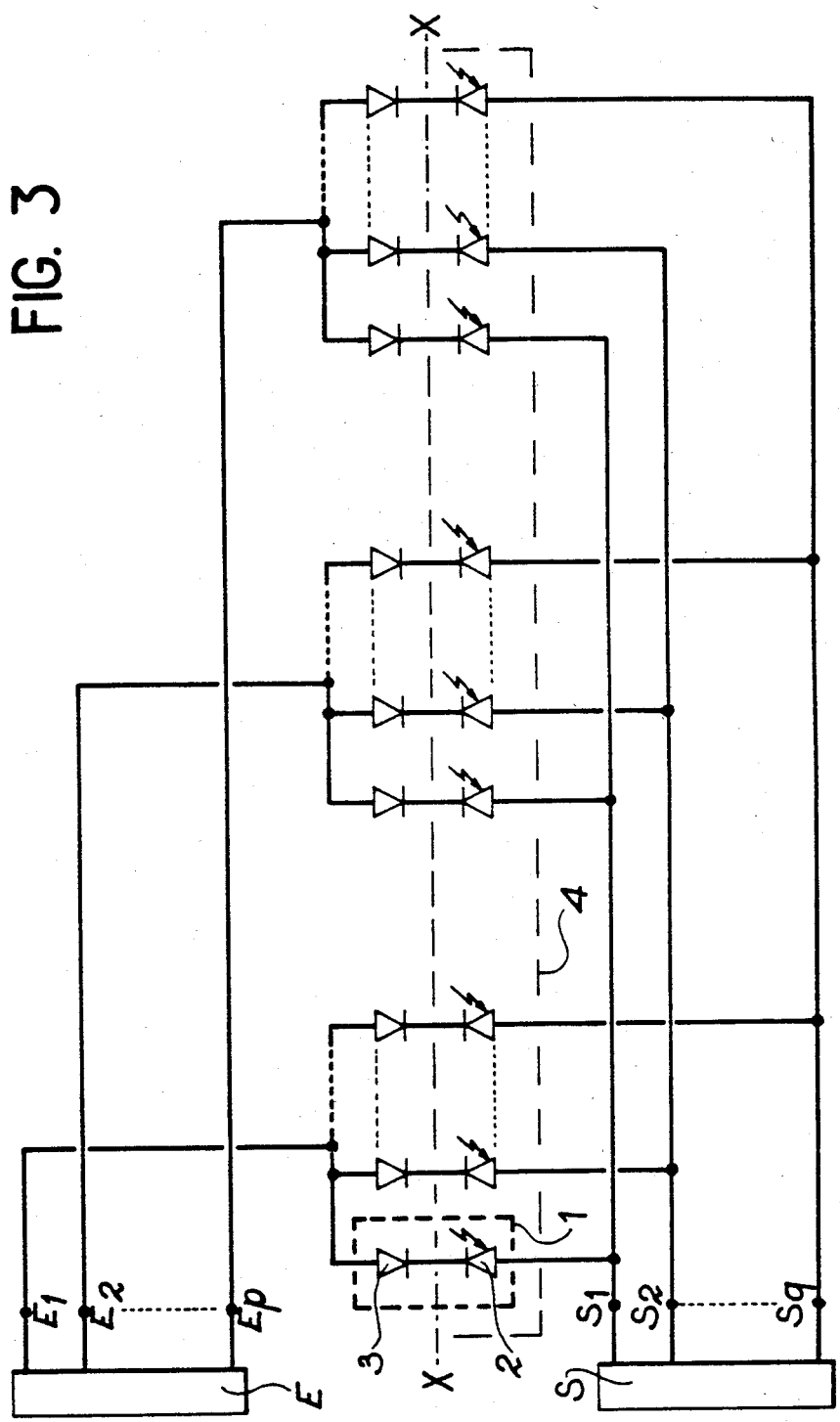
FIG. 3 schematically depicts a strip of photodetector elements.

Basic element 1 is the essential part of the reading apparatus depicted in FIG. 3. The basic elements 1 are arranged in p groups of q elements aligned along the axis XX. The group of photodiodes 2 constitutes the reading head 1. The apparatus is completed by a shift register-type circuit E, each of the p connections of which is connected to all the non-photosensitive diodes of a group of basic elements 1, and by a circuit S, each of the q connections of which is connected to all the photodiodes occupying a particular rank in a group. The use of a shift register eliminates the switches conventionally used in the input circuit, so that the signals are less noisy.

The analysis of the basic elements 1 takes place in the following way. Circuit E supplies on connection $E_1$ a voltage such that the elements of the first group are active, i.e. the characteristic of these elements is represented by the continuous line of FIG. 2b. In the case of the basic elements of FIG. 3, this corresponds to a voltage exceeding $V_0$. On the other connections $E_2$, $E_3$, . . . $E_p$, the circuit E supplies a voltage such that the elements of all the groups function in open switch form (dashed lines in FIG. 2b). In the case of the basic elements of FIG. 3, this corresponds to a voltage below $V_0$ and these basic elements 1 are then non-conductive.

Output circuit S comprises a group of switches, constituted e.g. by CMOS transistors, and an operational amplifier for amplifying to a usable level the signal supplied by the basic elements. The state of the switches is such that the connections $S_1$ . . . $S_q$ are permanently connected to ground. This considerably limits noise and stray currents and consequently improves the quality of the signal supplied by the operational amplifier.

In order to sequentially read each basic element 1 of the first group, it is merely necessary to control the switches in such a way that connections $S_1$ . . . $S_q$ are successively connected to the operational amplifier.

A reading in parallel (i.e. simultaneously of all of the basic elements of one group is possible if circuit S contains an operational amplifier for each output connection $S_1$ . . . $S_q$, instead of a single operational amplifier.

When all the basic elements of the first group have been read, circuit E applies to connection $E_1$ a voltage such that the basic elements of this group function as an open switch.

The basic elements of the other groups are successively read in the same way as those of the first group. The selection of the different groups takes place by sequentially applying to each connection $E_1 \ldots E_p$ a polarization voltage square wave pulse, which renders the basic elements connected to said connection conductive.

Figure 4:
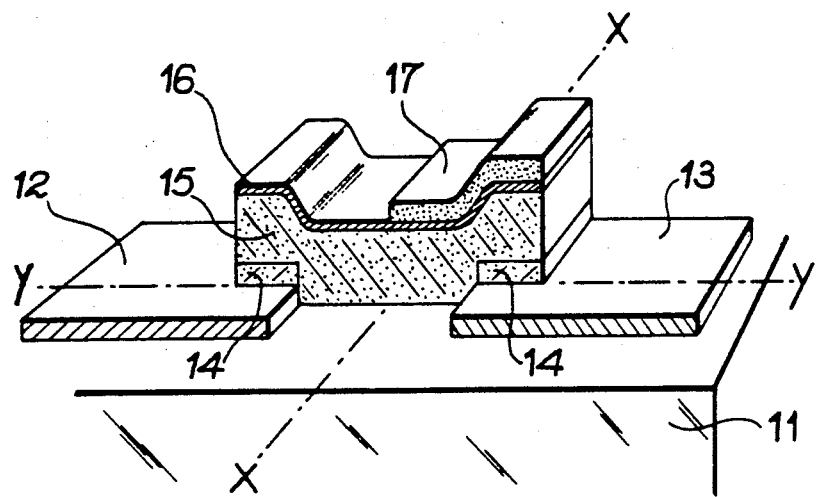
FIG. 4 is a perspective view of an embodiment of the basic element of the apparatus.

An advantage of the invention is the reduction of the parasitic noise on connections $S_1, S_2 \ldots S_q$ of output circuit S. Another advantage relates to the simplification of basic element 1 of the strip. FIG. 4 shows an embodiment of a basic element 1 according to the invention. The basic elements 1 are arranged with a spacing of 100 μm along axis XX. On an insulating substrate 11, each basic element 1 comprises two electrodes 12, 13, etched in a NiCr or $In_2O_3$ coating of thickened 3000 Å. These electrodes 12 and 13 are arranged along axis YY, axis XX passing between electrodes 12 and 13. This etching operation, as well as the subsequent coating deposition, is carried out by any known method. A hydrogenated amorphous silicon coating 14 of thickness 100 Å, which is highly doped with type N impurities, is deposited on part of each electrode 12 and 13. The function of coating 14 is to ensure a better ohmic contact. Coating 14 is covered by an intrinsic hydrogenated amorphous silicon coating 15 of thickness between 5000 and 10,000 Å. On coating 15 is deposited a Schottky metal coating 16, which is transparent to light radiation and sufficiently conductive. This metal, for example can be platinum. Finally a light radiation-opaque resin layer 17 is deposited along axis YY in a single half-plane defined by axis XX. Thus, there are two diodes having a common electrode, i.e. the Schottky metal, and each having an electrode on the substrate, the diode which is not covered by resin layer 17 being photosensitive.

Figure 5:
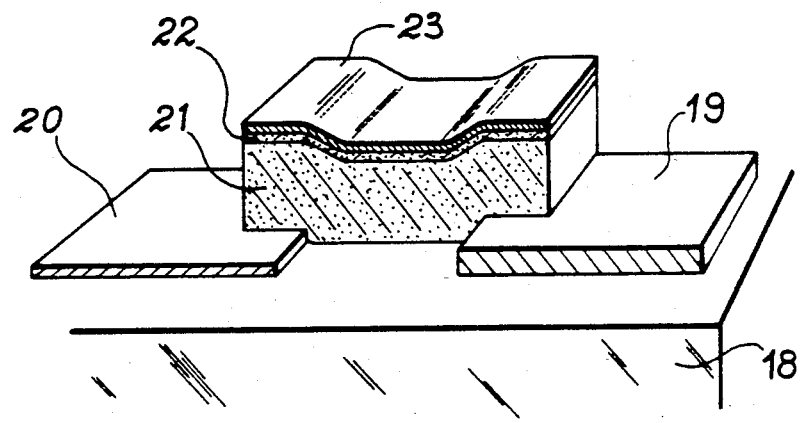
FIG. 5 is a perspective view of another embodiment of the basic element of the apparatus.

FIG. 5 shows another possible embodiment, in which the light rays reach the diode and photodiode across a transparent, insulating substrate 18. A coating 20 of Schottky metal is deposited, which is transparent to light radiation and sufficiently conductive and has a thickness of 100 Å, followed by a Schottky metal coating 19, which is opaque to light radiation and is of thickness 1000 Å. For example, this Schottky metal can be platinum. Coatings 19 and 20 are partly covered by an intrinsic hydrogenated amorphous silicon coating 21 having a thickness between 5000 and 10,000 Å. This layer 21 is covered by a hydrogenated amorphous silicon coating 22, which is highly doped with type N impurities and is of thickness 100 Å. Coating 22 is covered with a NiCr electrode 23 of thickness 3000 Å.

Other possible embodiments permit the use of photodetectors with PIN, PN or MIS diodes. It is also possible to use any other semiconductor deposited in thin coating form, such as polycrystalline silicon GaAs or CdSe.

What is claimed is:

1. In an apparatus for the point-by-point reading of a document including:
   (a) a matrix of photodetector elements, said matrix comprising p groups of q basic elements aligned along a first axis, each of said basic elements having an input terminal and an output terminal;
   (b) a circuit having p connections, each of said connections being connected to the input terminal of each of the q basic elements in a corresponding one of said p groups; and
   (c) an output circuit having q connections, each of said connections being connected to the output terminal of each of the basic elements occupying a corresponding position within said p groups,
   each of said basic elements comprising a photodiode and an associated diode which is insensitive to light radiation, said photodiodes and associated diodes each having a first electrode of one polarity and a second electrode of opposite polarity, said first electrode of each photodiode being connected to said first electrode of said associated diode, said second electrode of each photodiode serving as the output terminal of a corresponding one of said basic elements, and said second electrode of each associated diode serving as the input terminal of said corresponding one of said basic elements, said circuit comprising a shift register for supplying a polarization voltage pulse to each of said p connections in sequence in order to render the basic elements connected thereto conductive, the improvement wherein in each basic element the arrangement of layers of material in the interelectrode space of said photodiode is the same as the arrangement of layers of material in the interelectrode space of said associated diode.

2. The apparatus according to claim 1, wherein each of said basic elements comprises:
   (a) an insulating substrate,
   (b) said pair of first electrodes arranged along a second axis substantially perpendicular to said first axis and arranged substantially symmetrical with respect to said first axis;
   (c) a negatively doped semiconductor coating covering a part of each of said first electrodes;
   (d) an intrinsic semiconductor coating covering said negatively doped semiconductor coating and the portion of said insulating substrate lying between said first electrodes;
   (e) said pair of second electrodes, being formed as a common Schottky electrode covering said intrinsic semiconductor coating, asid Schottky electrode being transparent to light radiation; and
   (f) a resin layer covering part of said Schottky layer and arranged on one side of said first axis.

3. The apparatus according to claim 2, wherein said intrinsic semiconductor coating is made of intrinsic hydrogenated amorphous silicon.

4. The apparatus according to claim 1, wherein each of said basic elements comprises:
   (a) an insulating substrate which is transparent to light radiation;
   (b) said first electrode of said photodiode being a first Schottky electrode which is transparent to light radiation and which is arranged along a second axis substantially perpendicular to said first axis and on one side of said first axis;
   (c) said first electrode said diode being a second Schottky electrode which is opaque to light radiatin and which is arranged on the other side of said first axis substantially symmetrically with respect to said first Schottky electrode;
   (d) an intrinsic semiconductor coating arranged along said second axis and covering part of each of said first and second Schottky electrodes;
   (e) a highly negatively doped semiconductor coating covering said intrinsic semiconductor coating; and
   (f) said pair of second electrodes being formed as a common electrode covering said negatively doped semiconductor coating.

5. The apparatus according to claim 4, wherein said intrinsic semiconductor coating is made of intrinsic hydrogenated amorphous silicon.

* * * * *